United States Patent [19]
Atwater et al.

[11] Patent Number: 5,372,898
[45] Date of Patent: Dec. 13, 1994

[54] UNIVERSAL INEXPENSIVE BATTERY STATE-OF-CHARGE INDICATOR

[75] Inventors: Terrill Atwater, N. Plainfield; Richard M. Dratler, Lodi, both of N.J.

[73] Assignee: The United States of America as represented by the Secretary of the Army, Washington, D.C.

[21] Appl. No.: 200,614

[22] Filed: Feb. 17, 1994

[51] Int. Cl.⁵ .......................................... H01M 10/48
[52] U.S. Cl. ........................................ 429/90; 429/91; 320/48
[58] Field of Search .................. 429/90, 91, 92, 93; 320/2, 29, 43, 48; 324/426, 439; 340/636, 700

[56] References Cited
U.S. PATENT DOCUMENTS

| | | | |
|---|---|---|---|
| 4,727,006 | 2/1988 | Malinowski et al. | 429/90 X |
| 5,206,097 | 4/1993 | Burns et al. | 429/90 |
| 5,216,371 | 6/1993 | Nagai | 429/90 X |
| 5,256,500 | 10/1993 | Ishimoto | 429/93 |

*Primary Examiner*—Anthony Skapars
*Attorney, Agent, or Firm*—Michael Zelenka; William H. Anderson

[57] ABSTRACT

A discharge level monitor for a battery. The current flowing from the monitored battery is passed through a sensing resistor. The voltage across the resistor is amplified and integrated over time and the result of the integration is stored in a capacitor. The capacitor is discharged by a switch controlled by a logic circuit, whenever a threshold voltage is achieved. The cycle is repeated each time one coulomb capacity is removed from the battery. A counting circuit counts the number of charge/discharge cycles of the capacitor to produce a count which is representative of the amount of energy dissipated and therefore indirectly of the amount of energy remaining in the battery system.

13 Claims, 3 Drawing Sheets

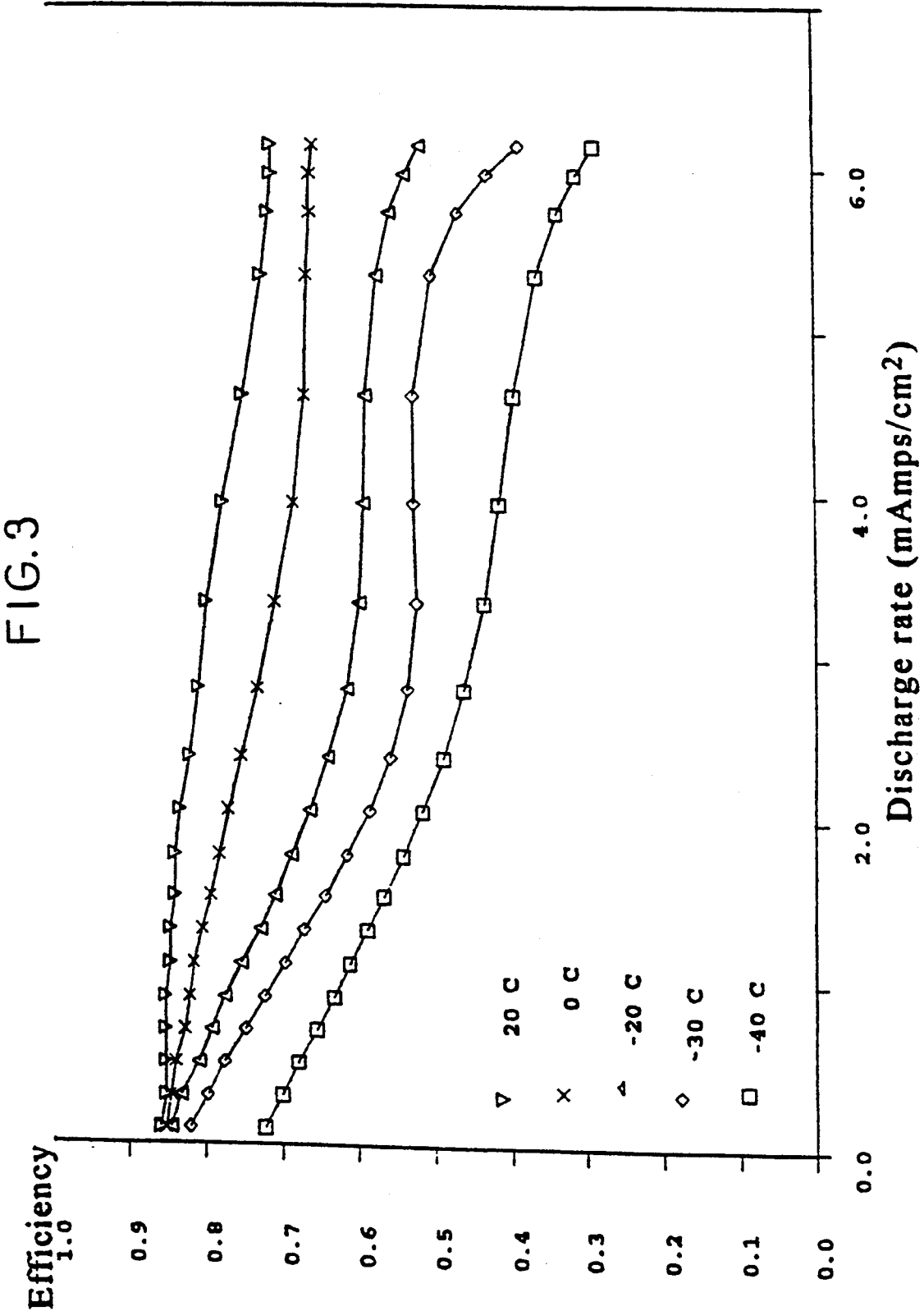

UNIVERSAL INEXPENSIVE BATTERY STATE-OF-CHARGE INDICATOR

The invention described herein may be manufactured, used, and licensed by or for the Government for governmental purposes without the payment to us of any royalty thereon.

FIELD OF THE INVENTION

The present invention relates to the field of battery energy monitoring systems and more particularly to a universal inexpensive battery state-of-charge indicator. The purpose of this invention to accurately monitor the state-of-charge of a battery, determine its status and display the results to the user. This invention applies to any battery system where knowledge of the battery's remaining capacity is desirable.

BACKGROUND OF THE INVENTION

Each year millions of dollars are spent on lithium batteries for use in portable electronics equipment. Because of their superior rate capability and service life over a wide variety of conditions, lithium batteries are the power source of choice for many equipment applications. There is no convenient method of determining the available capacity remaining in partially used lithium batteries. Hence, users do not take full advantage of all the available battery energy. In order to maintain readiness, users currently replace batteries on a conservative schedule. This practice results in the waste of millions of dollars in battery life or energy every year.

It is well documented and accepted that the available energy in a lithium battery is a function of the conditions to which the battery has been subjected. Capacity remaining is a complex function of current drain, temperature and time. Therefore, a reliable method of predicting remaining capacity has been actively sought. External monitoring/testing devices are available for most battery systems. However these devices are, in many cases, not portable and imprecise. Therefore a continuous internal means of determining capacity is desirable. Lithium/sulphur dioxide cell behavior at different temperatures and current drains have been examined. This examination has resulted in the establishment of discharge efficiency formulas. Utilization of these formulas has given rise to a capacity prediction algorithm.

The ability to monitor a battery's state of charge and display this to the user in real time allows for efficient utilization of battery energy. A simple technique for determining the state of charge of a battery is performed by measuring the voltage across the battery and relating this to the battery's state of charge. This method of determining the battery state of charge does not apply for many battery systems, particularly high power/high energy systems where knowledge of the state of charge is most important.

Another technique for determining the state of charge is performed by monitoring the energy removed, then by subtracting this value from the total capacity, the state of charge can be determined. This method is valid for all battery systems. However, large errors can occur whenever the battery is discharged at conditions different from the calibration standard.

Inexpensive accurate state of charge indicators for high power high energy batteries are not available to date. Accurate state of charge indication can only be achieved by taking the discharge rate and temperature into account.

SUMMARY OF THE INVENTION

It is an object of the present invention to provide an inexpensive, accurate state of charge indicator for a high power, high energy battery system which is simply implemented and which does not draw excessive power from the battery system being monitored.

It is a further object of the invention to provide an inexpensive, accurate state of charge indicator for battery systems which reliably indicates the state of charge for a variety of battery types.

By using a coulometer tuned to account for battery discharge efficiencies at varying rates and temperatures a highly accurate, inexpensive battery state of charge meter has been achieved.

The foregoing and other objects of the invention are realized in accordance with the present invention with a system in which the voltage drop across a resistor is used as a current sensor. To maintain accuracy, it is extremely important to continuously monitor the voltage across the resistor and to store this information. In the invention, the voltage across the sensor resistor is integrated and thus summed up over the life of the battery. This summation represents an average current.

An inexpensive method of integrating the voltage is to use a pair of PNP transistors and configure them as a conventional differential amplifier. A constant current source is used to prevent changes in cell voltage from affecting the data being collected. Besides amplifying the resistor's voltage, the differential amplifier converts the voltage to a current, which current is used to charge a capacitor. The voltage developed across the capacitor represents a capacity removed and is sensed by a comparator. The comparator and a processor convert the analog voltage to digital data.

The capacitor and resistor used in the circuit are tuned such that a threshold voltage represents one coulomb capacity removed. The capacitor is discharged by a switch controlled by a logic circuit, whenever the threshold voltage is achieved. This cycle is repeated each time one coulomb capacity is removed from the battery. A counting circuit counts the number of charge/discharge cycles of the capacitor to derive a count which represents the amount of energy dissipated, and indirectly the amount of energy remaining in the battery system.

A display system—in the preferred embodiment, a pair of diodes—is used to indicate the amount of battery life remaining.

Other features and advantages of the present invention will become apparent from the following description of the invention which refers to the accompanying drawings.

BRIEF DESCRIPTION OF THE DRAWINGS

FIG. 3 is a graph representing the relationships between discharge efficiency, temperature and constant current discharge rate for lithium/sulphur dioxide cells.

DETAILED DESCRIPTION

The remaining capacity of batteries is often determined by a simple technique that monitors the coulombic drain (Amperes seconds) from the battery. This information tells the user the capacity removed from the battery. When this information is subtracted from nominal full capacity, remaining capacity can be determined. This technique is valid only when discharge conditions remain constant. Variation in battery efficiency due to discharge conditions can result in large errors. Since discharge conditions of a battery are continually changing, it is desirable to utilize battery discharge efficiency on a continual basis. Designed capacity prediction circuitry calculates effective capacity removed from a battery based on discharge efficiency on a continual basis. In order to calculate effective capacity removed, discharge rate, temperature and time must be accounted for.

The voltage drop across a resistor is used as a current sensor. To avoid valuable power being wasted in the resistor a small valued resistor is used. The voltage across the resistor will be relatively small and must be amplified in order to bring it up to levels that can be processed. In addition, the voltage drop will fluctuate, due to varying discharge loads. Therefore, to maintain accuracy it is extremely important to continuously monitor the voltage across the resistor and store this information. One method of capturing this voltage is to use an integrator that would sum up the voltage over time. This summation represents an average current. Therefore the integration time should be minimal. The integrator can be of either analog or digital design; however, an analog integrator is far simpler to implement.

An inexpensive method of integrating a voltage is to use a pair of PNP transistors and configure them as a conventional differential amplifier. A constant current source is needed to prevent changes in cell voltage from affecting the data being collected. Besides amplifying the resistor's voltage, the differential amplifier converts the voltage to a current. This current is used to charge a capacitor. The voltage developed across the capacitor represents capacity removed and is sensed by a comparator. The comparator and processor convert the analog voltage to digital data.

The capacitor and resistor used in the circuit are tuned such that a threshold voltage represents one coulomb capacity removed. The capacitor is discharged by a switch controlled by the logic of the circuit whenever the threshold voltage is achieved. This cycle is repeated each time one coulomb capacity is removed from the battery.

Figure 1:
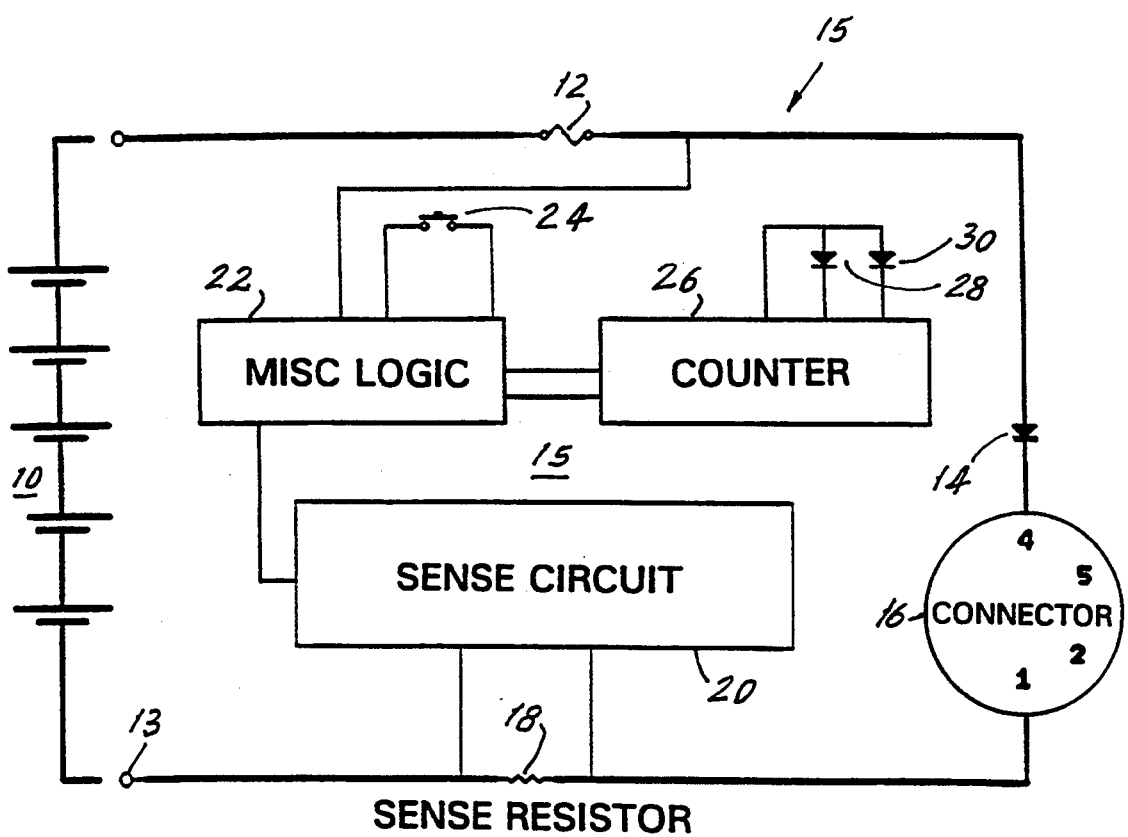
FIG. 1 is a block diagram of a universal battery state of charge indicator in accordance with the present invention.

With reference to the figures, FIG. 1 is a block diagram of the device of the present invention and illustrates a battery system 10 which is connected to the universal battery state of charge monitor and indicator 15 of the present invention via terminals 11 and 13. Positive electrical charge flows from the terminal 11 through a fuse 12 and a diode 14 to the terminal 4 of connector 16.

A load (not shown) is connected across the terminals 4 and 1 of the connector 16, whereby current flowing through the load continues through the sense resistor 18 back to the negative node of the battery system 10, via the terminal 13.

The sense circuit 20 senses the voltage across the sense resistor 18, for example, a 0.1 Ohm resistor, and this voltage which in actuality represents the current flowing through the load is integrated and used to charge an internal capacitor which discharges and produces a pulse in the miscellaneous logic block 22, whenever a coulomb of energy has been dissipated by the load. At that point, the capacitor is immediately discharged to repeat the cycle.

Each charge/discharge cycle causes the counter 26 to increment its count by one. The display diodes 28 and 30 are wired to the outputs of the counter. The state of the counter can be viewed by activating the diodes 28 and 30 by momentarily depressing the switch 24. Based on noting the lighting condition of the diodes 28 and 30, one determines the amount of battery life that is left. For example, when both of the diodes are lit more than 70% of the battery capacity is still available. If diode 28 is on and diode 30 is off, between 40 to 70% of the energy is still available. Similarly, 10-40% of the life of a battery is left when the diode 30 is lit and the diode 28 is off. When both diodes remain off upon depressing the switch 24, the user is informed that less than 10% of the battery life remains available for use.

Figure 2:
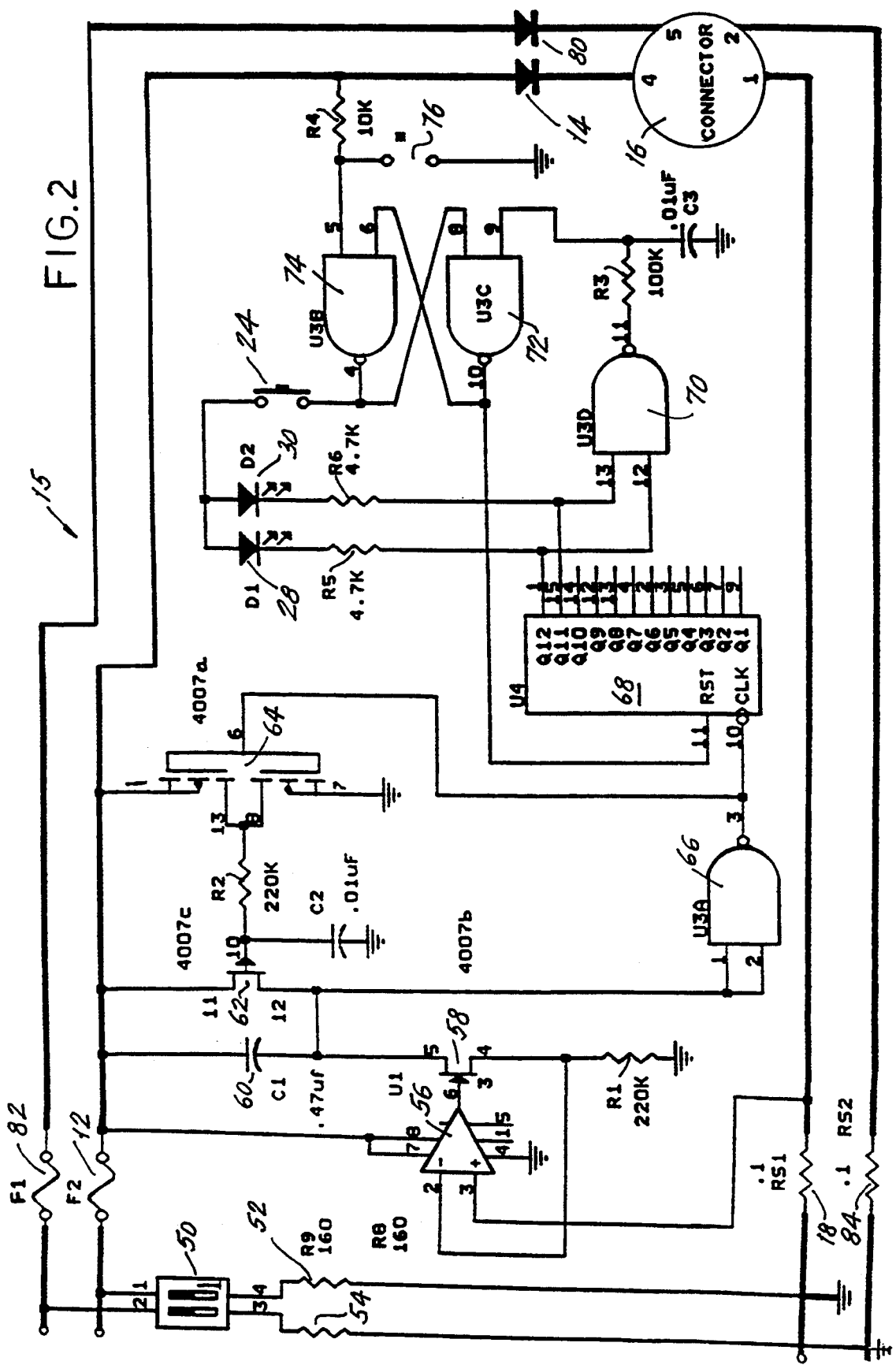
FIG. 2 depicts an electronic circuit for the universal battery state of charge indicator of FIG. 1.

A detailed electrical schematic of one embodiment of the invention is illustrated in FIG. 2. The battery system may be connected to cross the terminals 11 and 13, as in FIG. 1. The current flows through the fuse 12, diode 14, connector 16 and the sense resistor 18, as previously described with reference to FIG. 1.

The voltage across the sense resistor 18 is sensed in the operational amplifier 56 which in conjunction with the transistor 58 charges the capacitor 60. The operation of the transistor 62 in conjunction with the pair of PNP transistors 64 which are configured as a differential amplifier, is such that the capacitor 60 is typically charged when current flows into the load and is discharged each time one coulomb of energy is removed from the battery.

Upon consumption of one coulomb of battery energy, the output of the NAND gate produces a digital signal pulse edge at the clock input to the counter 68, advancing the count by one.

When the battery monitoring system 15 is initially installed, the counter 68 is reset to a count of zero. In time, as the number of charges/discharges of the capacitor 60 has reached a predetermined number, the Q12 and Q11 outputs of the counter 68 will toggle from the initial state of 0,0 to a 0,1, then 1,0 and eventually 1,1 digital values. The digital values of the Q12, Q11 outputs indicate the state of discharge of the battery system.

In operation, pressing the push button 24 produces the following effect. During the initial life of the battery, when the Q12, Q11 outputs are at 0,0, both of the diodes 28, 30 will be lit to indicate that more than 70% of the battery life is still available. When the output Q11 of the counter 68 will have reached a value 1, only the diode 28 will be lit to indicate that about 40 to 70% of the battery life is still available. Still later the value of Q12, Q11 will reach 1,0 which is indicative of 10-40% battery energy remaining. Eventually, when both Q12 and Q11 are at a digital value of "1", none of the diodes will be lit upon pressing the push button 24, indicating that less than 10% of the battery energy is available.

The function of the switch 76 is to initially reset the counter 68. AND gates 70, 72 and 74 cooperate to insure that when the output voltage of the battery is low (a condition to be expected near the end of the life of the battery) the counter 68 will not accidentally reset.

Note in FIG. 2 the fuse 82, diode 80 and sense resistor 84 which are connected in parallel with the corresponding fuse 12, diode 14 and sense resistor 18. A second battery system may be connected in series with the fuse 18, diode 14 and sense resistor 84 and its energy monitored and displayed based on the expectation that its rate of energy discharge will be identical to the first battery system actually being monitored, regardless of whether the load is connected in parallel across the two battery system or whether the battery systems are connected in series.

The element 50 is a switching mechanism which includes two switches, with one switch connected to the positive terminal 11 of one of the batteries and the other being connected through a resistor 52 to ground. The other switch is connected to another battery system and to ground via the resistor 54. When the battery system has neared the end of its useful life and it is desired to dispose of the battery, the switches in the switching device 50 are closed to assure that the battery will be fully discharged so that it will not constitute hazardous waste. This avoids complication, and extra costs associated with disposing of a partially charged battery.

FIG. 3 is a graphic representation of the relationship between discharge relative to frequency, temperature and constant current discharge rate for lithium/sulphur dioxide cells. It can be observed at a glance that the battery efficiency is adversely impacted by lower operating temperatures as well as by greater discharge rates.

$$Ed = \sum_{x=0}^{3} \sum_{y=0}^{3} C_{x,y} \cdot i^x \cdot T^y$$

The preceding equation is a polynomial fit of the surface relating discharge efficiency (Ed) to discharge current (i) and temperature (T). $C_{x,y}$ is a calibration constant dependent on cell chemistry, cell manufacturing and cell size.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A battery system monitor, comprising:
 a current sensing means for sensing current flowing from a battery to a load;
 a current integrator for measuring the amount of electrical energy flowing from the battery and for producing an output indicative of a predetermined amount of electrical charge having been discharged from the battery;
 a counter circuit for counting the output of the current integrator and for producing a counter output indicative of a discharge level of the battery; and
 a display coupled to the counter circuit for providing a visual indication of the discharge level of the battery.

2. The battery system monitor of claim 1, wherein the current sensing means is tuned to compensate for variations in temperature and discharge rate.

3. The battery system monitor of claim 2, wherein the current sensing means is configured such that changes in temperature and discharge rate cause the current sensing means to time itself.

4. The battery system monitor of claim 2, wherein the current sensing means is tuned such that a threshold wattage represents a predetermined amount of capacity removed.

5. The battery system monitor of claim 1, wherein the current sensing means comprises a current sensing resistor of a very low value.

6. The battery system monitor of claim 5, wherein the current sensing resistor has a value below one ohm.

7. The battery system monitor of claim 5, wherein the current integrator is an operational amplifier and including a storage capacitor, the operational amplifier being effective to charge the capacitor at a rate approximately proportional to the current flowing through the resistor.

8. The battery system monitor of claim 7, wherein the current integrator further includes a differential amplifier and the differential amplifier is operative to discharge the capacitor when a predetermined amount of electrical energy has been stored therein.

9. The battery system monitor of claim 7, wherein the counter circuit includes a flip-flop circuit which is coupled to the counter circuit to assure that the counter circuit does not accidentally reset when a battery voltage associated with the battery has dropped below a predetermined value.

10. The battery system monitor of claim 7, wherein the display comprises a plurality of diodes and the state of the diodes is indicative of the discharge level of the battery.

11. The battery system monitor of claim 10, further including means for selectively enabling the display.

12. The battery system monitor of claim 7, further including switch means connected across input terminals of the battery system monitor and configured to be set to a conductive state to discharge the battery prior to the battery being disposed of.

13. The battery system monitor of claim 7, wherein the battery includes first and second batteries and including means of enabling connection of the first and second batteries to a load in either a series or a parallel configuration and wherein the current flowing through the first battery is monitored and the discharge level of the first battery is assumed for the second battery.

* * * * *